United States Patent [19]
Minahan

[11] Patent Number: 5,432,318
[45] Date of Patent: Jul. 11, 1995

[54] APPARATUS FOR SEGMENTING STACKED IC CHIPS

[75] Inventor: Joseph A. Minahan, Simi Valley, Calif.

[73] Assignee: Irvine Sensors Corporation, Costa Mesa, Calif.

[21] Appl. No.: 178,923

[22] Filed: Jan. 7, 1994

Related U.S. Application Data

[63] Continuation-in-part of Ser. No. 996,794, Dec. 24, 1992, Pat. No. 5,279,991, which is a continuation-in-part of Ser. No. 884,719, May 15, 1992, abandoned.

[51] Int. Cl.⁶ ............................................. H05B 3/00
[52] U.S. Cl. .................... 219/385; 156/344; 156/584; 219/521
[58] Field of Search ................. 219/385, 386, 521; 392/340, 395; 338/203; 156/247, 344, 584; 29/650, 762

[56] References Cited

U.S. PATENT DOCUMENTS 4,811,861 3/1484 Roberts .
5,240,546 8/1993 Shiga .

FOREIGN PATENT DOCUMENTS 2547734 12/1984 France ............................. 392/390

Primary Examiner—Teresa J. Walberg
Attorney, Agent, or Firm—Plante & Strauss

[57] ABSTRACT

A tool for segmenting a stack of bonded IC chips into short stacks includes a heat conducting base having at least one cavity in its upper face for receiving a portion of an IC chip stack. The length and width dimensions of the cavity are essentially the same as the corresponding dimensions of the stack. The depth of the cavity is selected to correspond to the desired thickness of the short stack to be formed from the stack. The base is heated to raise the temperature of the cavity walls to heat the stack above the softening point of the bonding material. A driver is movably mounted on the base for contact with a portion of a face of the stack extending above the opening of the cavity, and a threaded rod supported on the base urges the driver against the stack to effect separation of the extending portion of the stack from the segment portion which remains in the cavity. A track in the upper surface of the base is provided for travel of the driver.

14 Claims, 2 Drawing Sheets

APPARATUS FOR SEGMENTING STACKED IC CHIPS

GOVERNMENT SUPPORT

This invention was made with government support under contract S29601-89-C-0014, Subcontract SC-0014-89-0017, awarded by the Department of the Air Force. The government has certain rights in the invention.

CROSS REFERENCE TO RELATED APPLICATIONS

This application is a continuation-in-part of my application Ser. No. 996,794, filed Dec. 24, 1992, now U.S. Pat. No. 5,279,991, which was a continuation-in-part of Ser. No. 884,719, filed May 15, 1992, now abandoned.

FIELD OF THE INVENTION

The present invention relates to electronic modules comprising stacked integrated circuit carrying chips and more particularly to the method and apparatus for segmenting such electronic modules into smaller stacks.

BACKGROUND OF THE INVENTION

High density electronic modules are formed from stacks of integrated circuit carrying chips which are electrically connected and bonded. These stacks are used to provide very densely packed electronic circuitry in a small package to conserve space. A process and apparatus for forming such electronic stacks are described in U.S. Ser. No. 674,096, filed Nov. 23, 1984. The process comprises the steps of measuring the thickness of the chips and placing the chips in an appropriate storage location depending on the thickness characterization of the chips. The chip thickness data is used in a computer program to determine the optimum stacking order of measured chips for a given stack. The chips are cleaned and stacked with a measured quantity of epoxy deposited between the faces of each pair of adjacent chips. Pressure is applied to the stack perpendicularly to the planes of the chips to confine the stack to a predetermined thickness. The epoxy is cured under heat to bond the individual chips into a single stack.

The chips are coated on each upper surface with an excess of adhesive and stacked in the receptacle on the top of the fixture where they are then subjected to compression in the fixture to compress the stack of chips into essentially its final thickness. The fixture is then transferred to an oven and the stack is cured at a temperature ranging from 120° C. to 250° C. for one to three hours, depending upon the adhesive used. After curing the stack is removed from the fixture and processed to remove excess adhesive from the surfaces of the stack. Passivation layers, metal pads, buslines and the like, as may be required by the end use for the stack, are attached following the curing operation.

Such stacks are highly useful in those environments requiring a large amount of electrical circuitry in a small space. For example U.S. Pat. No. 4,525,921 describes the manufacture and the use of stacked circuit carrying chips for general electronic purposes, including computer memory components. U.S. Pat. No. 4,551,629 describes stacked chip modules having a plurality of photo detectors secured to one access plane of the stack to comprise a dense array of radiation/electronic transducers.

Generally an electronic stack comprises in excess of 50 individual circuit carrying chips stacked as described above. However, there is an expanding need for shorter stacks that will fit into a space normally occupied by a single IC chip. The space available can be referred to as "headroom" and "footprint" and in circuit and hardware design this space is often of critical importance. Thus, increasing circuitry without increasing the headroom and footprint of the circuit carrying device is highly desireable. Processing a short stack as an individual item is very difficult in view of the lithography and other processing steps necessary to produce an IC chip stack. Consequently, it is necessary to process a full stack and subsequently segment the stack to produce short stacks. Various methods have been suggested for segmenting a stack of IC chips to form smaller stacks. Segmentation processes involve heating the stack of IC chips to soften the thermoplastic adhesive between the segmentation planes after which segments of the desired thickness are removed from the larger stack. This is a labor intensive and time-consuming operation for which, prior to this invention, no practical tool was available.

SUMMARY OF THE INVENTION

In accordance with the present invention, apparatus is provided for the segmentation of IC chip stacks to form short stacks containing fewer chips. In general, the apparatus functions to heat the stack above the softening point of the thermoplastic bonding material at the segmentation planes and to separate the stack at a selected segmentation plane. A segmentation plane, as used herein, is the plane defined between two cap chips. Cap chips are placed on the upper and lower surfaces of a chip stack to protect the circuit carrying silicon chips of the stack. Preferably the material of choice for a cap chip is aluminum nitride. Aluminum nitride has the desired dielectric properties, a relatively high thermal conductivity and a thermal coefficient of expansion very close to that of silicon.

The apparatus comprises a heat conducting base having at least one cavity in its upper face for receiving a portion of an IC chip stack. The length and width dimensions of the cavity are essentially the same as the corresponding dimensions of the stack. The depth of the cavity is selected to correspond to the desired thickness of the short stack to be formed from the stack. Heating means in the base raises the temperature of the cavity walls to heat the stack above the softening point of the thermoplastic adhesive. A driver is movably mounted on the base for contact with a portion of a face of the stack extending above the opening of the cavity. Means are provided for causing the driver to act against the stack to effect separation of the stack from the segment portion in the cavity.

The base preferably is provided with a track in which the driver is slidably disposed for precisely guiding the driver against the stack. A plate having an internally threaded opening receives a threaded rod, one end of which contacts the driver for translation of rotation of the rod to linear movement of the driver. Heat control means are provided to control the temperature at the cavity walls.

In a preferred embodiment of the invention, the base contains two cavities, two screw actuated drivers and a pair of parallel groves in the base that receive the bottom portion of the respective driver and serve as the tracks therefore. The depth of the cavities may be the same for producing pairs of segments of equal thickness in a single setup. In the alternative, the cavities may be of different depths for simultaneously producing segments of different thicknesses.

The invention will be more completely understood from the following detailed description of the preferred embodiment taken in conjunction with the drawings.

DETAILED DESCRIPTION OF THE INVENTION

Figure 1:
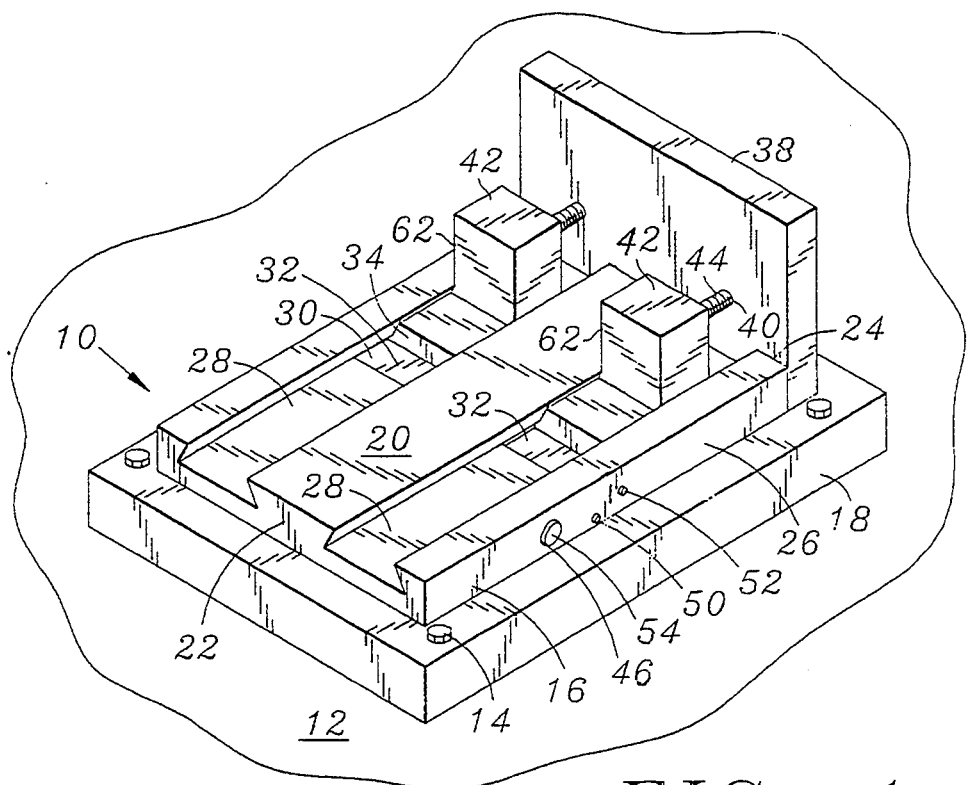
FIG. 1 is a perspective view of a preferred embodiment of a segmentation tool designed in accordance with the present invention.

As shown in FIG. 1 the segmentation tool, shown generally as 10, is mounted on a suitable stable platform such as a work bench or the like by a mounting plate 12 suitably secured to the work bench by bolts 14. The segmentation tool 10 includes a base 16 that is thermally insulated from the mounting plate 12 by an insulation block 18. The insulation block is formed of a suitable heat insulating material, preferably Teflon. The base 16, which is rectangular, includes an upper surface 20, front and rear faces, 22 and 24, and side surfaces 26. Parallel running grooves 28 extend across the upper surface 20 of the base 16 from the front face 22 to the rear face 24. A stack cavity 30 is formed in the bottom of each groove 28. Each stack cavity 30 has a floor 32 and an open mouth 34 of suitable dimensions to receive and support the base of a stack 36 of IC chips that are to be segmented. A back plate 38 is disposed on the rear face 24 of the base 16 and extends normally upwardly above the upper surface 20 of the base 16. The back plate 38 is provided with two threaded openings 40, each of which is aligned with a groove 28 in the upper surface 20 of the base 16. A driver body 42 is slidably disposed in each of the grooves 28 for reciprocal movement therealong responsive to the rotation of a threaded rod 44 that is disposed in and extends through each of the openings 40 in the back plate 38. Rotation of the threaded rod 44 is translated into linear motion of the driver body 42.

Figure 2:
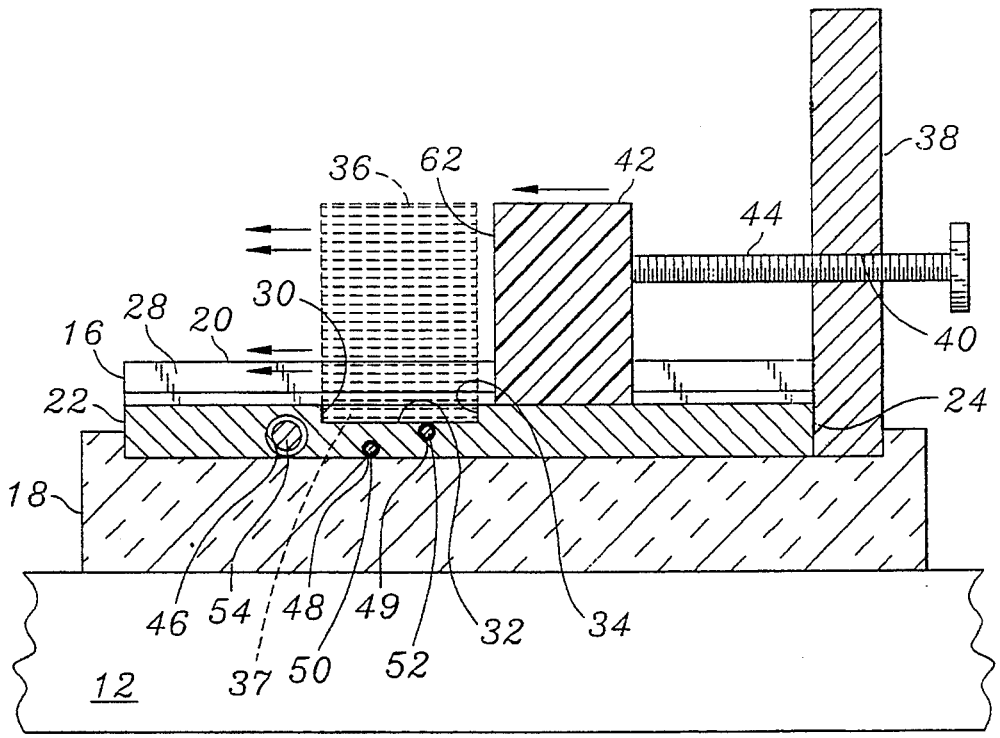
FIG. 2 is a side view, partially in section and partially broken away for compactness of illustration, of the segmentation tool of FIG. 1.
Figure 3:
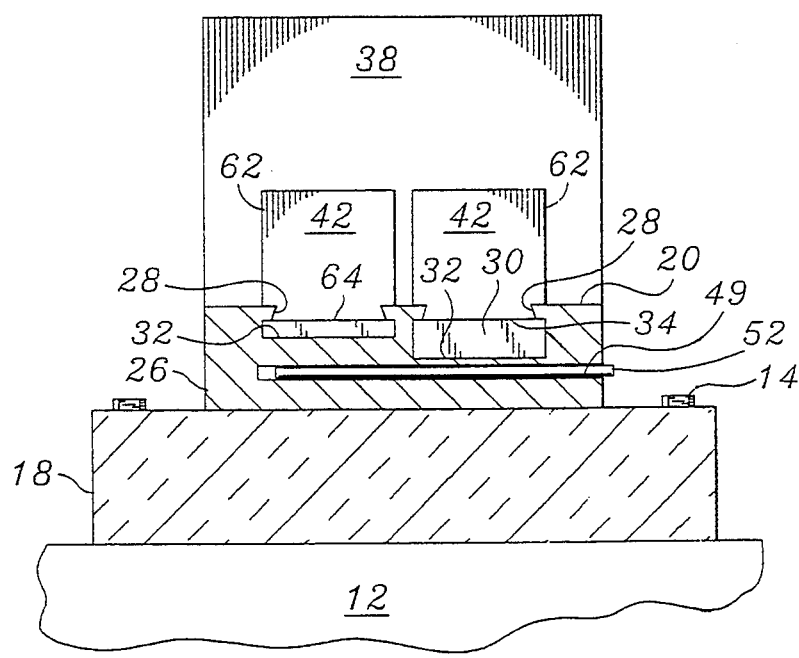
FIG. 3 is a front sectional view of the segmentation tool of FIG. 1.
Figure 4:
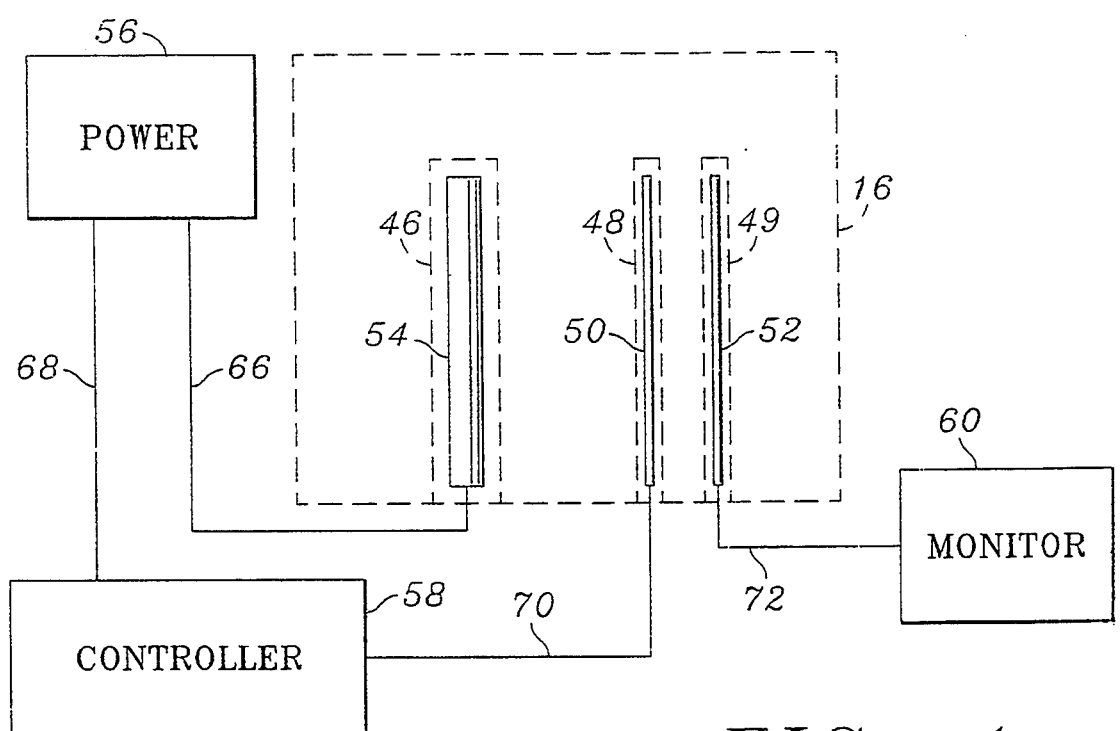
FIG. 4 is a schematic diagram of circuitry for heating the base and controlling the cavity temperature of the segmentation tool in accordance with the present invention.

Referring to FIGS. 2 and 3, a heater compartment 46 and two thermocouple compartments 48 and 49 are provided in the base 16 and extend generally normally to the longitudinal axes of the base 16. The thermocouple compartments, 48 and 49, are located in the base 16 adjacent to and below the cavities 32. A control thermocouple 50 is located in thermocouple compartment 48 and a monitor thermocouple 52 is located in the thermocouple compartment 49. A resistance heating rod 54 is disposed in the heating element compartment 46 for heating the base 16. The heating element 54 and control thermocouple 50 are electrically connected to a power source 56 and a controller 58 (FIG. 4). The monitor thermocouple 52 is electrically connected to a suitable temperature monitor 60 (FIG. 4), such as for example a strip chart recorder for monitoring and maintaining a record of the temperature in the base 16.

As shown in FIGS. 2 and 3, each driver body 42 is provided with a contact face 62 for contact with a plane of the stack 36 being segmented. The driver body 42 is block shaped and provided with a lower depending portion 64 having upwardly inwardly biased side surfaces. Each groove 28 has corresponding upwardly inwardly biased sides that define a track for the depending portion of the driver body 42.

The driver body 42 is preferably composed of a metal, such as aluminum or stainless steel. A high temperature lubricant is used to minimize friction to allow the driver body 42 to smoothly travel along the groove 28 without binding or stuttering. Linear motion is imparted to the driver body 42 by rotation of the threaded rod 44. The rod 44 is rotated to urge the contact face 62 of the driver body 42 against a plane of the stack 36 being segmented.

As is most clearly shown in FIG. 3, each cavity 30 has a different depth so that the segments formed are of differing thicknesses. The depth of each cavity 30 is selected so that the top edge of the cavity occurs immediatly below a segmentation plane formed at the interface of two cap chips bonded by thermoplastic adhesive. The lower edge of the driver body 42 contacts the stack 36 just above the segementation plane of the stack so that there is a clean separation of the stack from the resulting segment 37 produced by the urging of the driver body 42 against the plane of the stack extending above the cavity 30. It will be understood that the cap chips are placed in the stack during the stack production phase and that the thickness or number of IC chips in a short stack is predetermined so that the cap chips can be appropriatly located in the stack.

As is best shown in FIG. 4 the base 16 is heated by the heater element 54 that is located in the heater element compartment 46. The heater element 54 is electrically connected by a line 66 to the power supply 56. The controller 58 is electrically connected by a line 68 to the power supply 56 and by a line 70 to the controller thermocouple 50 for controlling the temperature in the base 16 responsive to signals from the controller thermocouple. The monitor thermocouple 52 is electrically connected by a line 72 to the monitor 60 for readout and recording of the temperature in the base 16.

In operation, the tool 10 is brought to operating temperature by activating the heating element 54 to heat the base 16. Operating temperature is a temperature sufficient to soften the thermoplastic adhesive material used to bond the cap chips which define the segmentation planes of the stack 36. Among the materials which can be used for bonding the chips into a stack are the polyimide and epoxy thermoplastic adhesives, with polyimide compositions being preferred. The base 16 is then brought to a temperature above the softening point of the adhesive. An IC stack 36 to be segmented is placed in a cavity 30 formed in the upper surface 20 of the base 16. After allowing sufficient time for the thermoplastic adhesive to soften in the portion of the stack received in the cavity, the planer face 62 of the driver body 42 is brought into contact with the facing plane of the stack 36 extending above the cavity 30. Rotation of the threaded rod 44 is translated into linear motion to move the driver body 42 against the extending portion of the stack 36, forcing it to separate from the segment held in the cavity 30 at the segmentation plane adjacent to the edge of the open mouth 34 of the cavity 30. The urging of the driver block against the extending portion of the stack 36 causes it to slide on the softened adhesive of the segmentation plane moving the extending portion of the stack out of alignment with the cavity and leaving a segment of stacked IC chips within the cavity. The segment is retrieved from the cavity. Throughout the process the temperature is consistently monitored by the monitor thermocouple 52. The signals from the thermocouple 52 are used by the controller 58 to control power to the heating element 54 to maintain a constant temperature in the base 16. The signals from the monitor thermocouple 52 are continuously read out and recorded by the monitor 60.

It will be understood that the base 16 is formed from a heat conductive material for the even distribution of heat to the cavity 30 for softening the bonding material of the stack. Preferred materials are aluminum, copper and stainless steel.

While the tool has thus far been described in connection with the use of a threaded rod 44 to actuate and drive the driver bodies 42 in the grooves 28 of the base 16, it will be understood that other means for applying reciprocal movement to the driver body may be employed. For example solenoid or piston driven means may be used to drive the driver body, particularly if the operation is to be automated.

It will also be understood that the base 16 may be adapted to allow for the vertical adjustment of the floor 32 of the cavities 30 so that the cavity depth can be adjusted as desired. In such an embodiment silicon or metal shims can be employed to vertically adjust the floor 32.

As will be understood by those skilled in the art, various arrangements other than those described in detail in the specification will occur to those persons, which arrangements lie within the spirit and scope of the invention. It is therefore to be understood that the invention is to be limited only by the claims appended hereto.

Having described the invention, I claim:

1. An apparatus for segmenting a stack of integrated circuit chips into short stacks, said stack including at least one segmentation plane defined by a pair of contiguous cap chips united by a thermoplastic bonding material, said apparatus comprising:
    a. a heat conducting base having a front and rear face and an upper surface, at least one cavity in said base opening on the upper surface, said cavity defining a floor and walls in said base and being proportioned to receive a portion of a stack of integrated circuit chips to be segmented into a short stack, an extending portion of said stack projecting out of the cavity;
    b. a compartment in said base having heating means contained therein, the heat generated thereby being conducted to the walls of the cavity;
    c. driver means reciprocally mounted on the upper surface of said base for movement over the cavity opening, said base being provided with a track in which said driver means is slidably disposed., said track comprising a groove in the upper surface extending from the front face to the rear face of said base and intersecting the cavity opening;
    d. means for applying reciprocal movement to said driver means; and
    e. means for controlling said heating means to maintain at least the cavity walls at a desired temperature.

2. The apparatus of claim 1 wherein said means for applying reciprocal movement to said driver means comprises a plate disposed on the rear face of said base extending normally upwardly above the upper surface of said base, said plate having at least one internally threaded opening, a threaded rod extending perpendicularly through the threaded opening, said threaded rod carrying said driver means on one end to act against the extending portion of said stack responsive to the translation of rotation of said rod to linear movement of said driver means.

3. The apparatus of claim 1 wherein said driver means comprises a body reciprocally mounted on the upper surface of said base, said body including a planar contact face for contact with a planar surface of the extending portion of said stack.

4. The apparatus of claim 3 wherein said means for applying reciprocal motion to said driver body includes an upwardly extending plate disposed on the rear face of said base, said back plate being provided with a threaded opening, a threaded rod is disposed in and extends through said threaded opening, said threaded rod carrying a driver body on one end.

5. The apparatus of claim 1 wherein said driver means consists of a block-shaped driver body provided with a lower depending portion having upwardly inwardly biased side surfaces, said groove having corresponding upwardly inwardly biased sides to define a track in which the depending portion of said driver body is received.

6. The apparatus of claim 1 comprising at least a pair of parallel grooves in said upper surface of said base extending from the front face to the rear face of said base and a cavity in each of said grooves opening to the upper surface of said base, and wherein said driver comprises a driver body having a lower depending portion received in each of said grooves and being mounted on the upper surface of said base for reciprocal movement along said grooves.

7. The apparatus of claim 6 wherein the floor of each of the cavities is equally vertically disposed with respect to the upper surface of said base.

8. The apparatus of claim 6 wherein the floor of each of the cavities is disposed at a different vertical distance from the upper surface of said base.

9. The apparatus of claim 1 wherein said heating means is a resistance heating element, and said base further includes a pair of thermocouple-containing compartments in said base, the compartments extending from a side face of said base normal to the longitudinal axes thereof and terminating therein adjacent to and below the cavity.

10. The apparatus of claim 9 wherein a control thermocouple is located in one of the thermocouple compartments and a monitor thermocouple is located in the other thermocouple compartment.

11. An apparatus for segmenting a stack of integrated circuit chips into shorter stacks, said stack including at least one segmentation plane defined by two chips united by a softenable thermoplastic bonding material, said apparatus comprising:
    a. a heat conducting base having a planar upper surface, at least one cavity in said upper surface defining a floor and walls in said base and being proportioned to receive a portion of a stack of bonded, integrated circuit chips to be segmented into a shorter stack, an extending portion of said stack projecting out of said cavity;

b. a heater in said base, the heat generated thereby being conducted to the walls and base of said cavity;

c. a driver slidably mounted on said upper surface of said base for movement over the opening of said cavity and within a track in the upper surface of said base comprising a groove in said upper surface intersecting said cavity opening;

d. means for forcing said driver slidably along said track; and e. a temperature controller for controlling said heater to maintain at least said cavity walls at about a desired temperature.

12. The apparatus defined in claim 11, wherein said driver comprises a driver body comprising a lower depending portion having upwardly, inwardly biased side surfaces, said groove having corresponding upwardly, inwardly biased sides to define a track in which said depending portion of said driver body is retained to prevent tilting of said driver body during its travel along said track.

13. The apparatus defined in claim 11 further comprising a stack of bonded, integrated circuit chips positioned within said cavity, the planes of said circuit chips in said stack being substantially parallel to the plane of said upper surface of said base, the lower chip in said stack being supported by the bottom surface of said cavity, and the lateral dimensions of said chips and said stack within the plane of said base corresponding substantially to the dimensions of said cavity and the plane of said base, the depth of said cavity and the thickness of said chips being such that said driver, when slidably forced along said track, contacts a portion of the face of the stack extending above the opening of said cavity to effect separation of the extending portion of the stack from the segment portion remaining in said cavity.

14. The apparatus defined in claim 13, wherein said segmentation plane is defined by a pair of contiguous cap chips united by said heat-softenable thermoplastic bonding material, and the lower surface of the upper cap chip at said segmentation plane is below the leading edge of said cavity and above the trailing edge of said cavity.

* * * * *